United States Patent
Liao et al.

(10) Patent No.: US 9,843,012 B2
(45) Date of Patent: Dec. 12, 2017

(54) TOP EMITTING ORGANIC ELECTROLUMINESCENT DEVICES

(71) Applicant: Industrial Technology Research Institute, Chutung, Hsinchu County (TW)

(72) Inventors: Jung-Yu Liao, Chutung (TW); Tien-Shou Shieh, Chutung (TW); Pei-Ching Liu, Chutung (TW)

(73) Assignee: Industrial Technology Research Institute, Chutung (TW)

( * ) Notice: Subject to any disclaimer, the term of this patent is extended or adjusted under 35 U.S.C. 154(b) by 0 days.

(21) Appl. No.: 14/583,214

(22) Filed: Dec. 26, 2014

(65) Prior Publication Data

US 2016/0190498 A1 Jun. 30, 2016

(51) Int. Cl.
| | |
|---|---|
| H01L 29/08 | (2006.01) |
| H01L 51/52 | (2006.01) |
| H01L 51/50 | (2006.01) |
| H01L 51/00 | (2006.01) |

(52) U.S. Cl.
CPC ...... *H01L 51/5237* (2013.01); *H01L 51/5044* (2013.01); *H01L 51/5268* (2013.01); *H01L 51/5271* (2013.01); *H01L 51/0067* (2013.01); *H01L 51/0085* (2013.01); *H01L 2251/5315* (2013.01)

(58) Field of Classification Search
CPC ... H01L 51/00; H01L 2251/00; H01L 25/046; H01L 33/508; H01L 33/60; H01L 33/025; H01L 33/26; H01L 33/305; H01L 33/346
USPC .......................................... 257/40, 101–103
See application file for complete search history.

(56) References Cited

U.S. PATENT DOCUMENTS

| | | | |
|---|---|---|---|
| 6,965,197 B2 | 11/2005 | Tyan et al. | |
| 7,122,955 B2 | 10/2006 | Tseng et al. | |
| 7,531,955 B2 | 5/2009 | Cok et al. | |
| 7,594,839 B2 | 9/2009 | Cok et al. | |
| 7,619,359 B2 | 11/2009 | Kim | |
| 8,022,619 B2 | 9/2011 | Birnstock et al. | |
| 8,258,693 B2 | 9/2012 | Cok et al. | |
| 2012/0228591 A1 | 9/2012 | Sawabe et al. | |
| 2013/0154473 A1 | 6/2013 | Kaneko et al. | |
| 2014/0138649 A1 | 5/2014 | Chen et al. | |
| 2014/0145160 A1 | 5/2014 | Cho et al. | |
| 2014/0153029 A1 | 6/2014 | Kasahara | |
| 2015/0123093 A1* | 5/2015 | Reusch | H01L 51/5275 257/40 |

FOREIGN PATENT DOCUMENTS

| | | | | |
|---|---|---|---|---|
| CN | 103682129 A | 3/2014 | | |
| DE | WO 2013164271 A1 * | 11/2013 | ......... | H01L 51/5275 |

(Continued)

OTHER PUBLICATIONS

Fan et al., "Enhancement of light extraction of green top-light-emitting diodes with refractive index gradually changed coupling layers," *Org. Electronics*, 14:3234-3239 (2013).

(Continued)

*Primary Examiner* — Hung Vu
(74) *Attorney, Agent, or Firm* — McCarter & English, LLP; Yu Lu

(57) ABSTRACT

The present disclosure provides a top emitting organic electroluminescent device including a first scattering layer, and a first electrode, at least one organic material layer, a second electrode and a second scattering layer formed on the first scattering layer sequentially. The first scattering layer contains a plurality of micro-particles that are 10 to 90 wt % of the first scattering layer.

18 Claims, 13 Drawing Sheets

(56) References Cited

FOREIGN PATENT DOCUMENTS

| | | | |
|---|---|---|---|
| JP | 2006252857 A | 9/2006 | |
| JP | 2010067383 A | 3/2010 | |
| JP | 2013084461 A | 5/2013 | |
| JP | 2014086383 A | 5/2014 | |
| TW | I261484 B | 9/2006 | |
| TW | 201251505 A | 12/2012 | |
| TW | 201421765 A | 6/2014 | |
| WO | WO-2008135891 A1 | 11/2008 | |

OTHER PUBLICATIONS

Lee et al., "Effect of transparent film desiccant on the lifetime of top-emitting active matrix organic light emitting diodes," *Appl. Phys. Letts.*, 90:103518-1-103518-3 (2007).

Murakami et al., "High-Efficiency and High-Operational-Stability Top-Emitting Organic Light-Emititing Diodes Using Antioxidant Buffer Layer," *Jpn. J. Appl. Phys.*, 48:081501-1-018501-6 (2009).

Nakanishi et al., "Improvement of the light extraction efficiency of top-emitting organic light-emitting diodes by a two-dimensional diffraction layer fabricated using self-assembled nanoparticles," *Applied Optics*, 49(31):5889-5896 (2009).

Wu et al., "Use of surface plasmon-coupled emission for enhancing light transmission through Top-Emitting Organic Light Emitting Diodes," *Thin Solid Films*, 516:1977-1983 (2008).

CN 103682129 English abstract.
JP 2006252857 English abstract.
JP 2010067383 English abstract.
JP 2013084461 English abstract.
JP 2014086383 English abstract.
TW I261484 English abstract.
TW 201421765 English abstract.
Office Action issued May 10, 2016 in TW 130145672.

\* cited by examiner

TOP EMITTING ORGANIC ELECTROLUMINESCENT DEVICES

BACKGROUND

1. Technical Field

The present disclosure relates to organic electroluminescent devices, and, more particularly, to a top emitting organic electroluminescent device.

2. Description of Related Art

A typical top light emitting device comprises a bottom reflecting electrode and a top translucent electrode. Such a structure may result in enhanced emission at a specified wavelength and inhibited emission at non specified wavelength, causing a microcavity effect. The emitting light spectrum is sharpened and the color purity is improved due to the microcavity effect. For instance, with regard to emitting a single color light in a display with primary color pixels of RGB, the microcavity effect may enhance the emission and color purity, as well as increase the color gamut and color saturation.

However, microcavity has no beneficial effect for the use in lighting applications. Since the spectrum for lighting requires a full distribution of light intensity across visible light range (from 380 to 780 nm), microcavity effect only enhances emission at a certain wavelength, but inhibits emission at the other wavelengths, thereby adversely affecting the color spectrum of white light illumination.

Therefore, how to increase the light extraction efficiency and maintain its spectrum distribution of lighting devices have become urgent.

SUMMARY

The present disclosure provides a top emitting organic electroluminescent device, comprising: a first scattering layer having a first polymer and a plurality of first micro-particles, wherein the first micro-particles are 10 to 90 wt % of the first scattering layer; a first electrode formed on the first scattering layer; at least one organic material layer formed on the first electrode; a second electrode formed on the organic material layer; and a second scattering layer formed on the second electrode and having a second polymer and a plurality of second micro-particles.

In the top emitting organic electroluminescent device according to the present disclosure, the first scattering layer and the second scattering layer create more new directions in which light travels, such that the microcavity effect of the top emitting element is effectively reduced and eliminated, the light spectrum is close to that of a bottom emitting device, and light extraction efficiency is enhanced.

DETAILED DESCRIPTION

Figure 1:
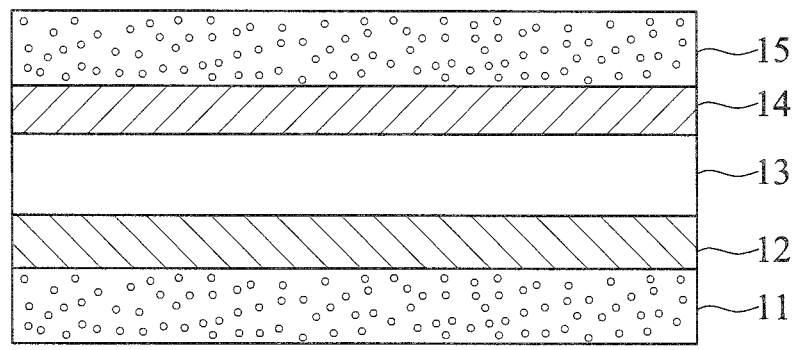
FIG. 1 is a schematic view showing a top emitting organic electroluminescent device according to the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

As shown in FIG. 1, the present disclosure discloses a top emitting organic electroluminescent device, comprising: a first scattering layer 11, a first electrode 12, at least one organic material layer 13, a second electrode 14 and a second scattering layer 15.

Figure 2:
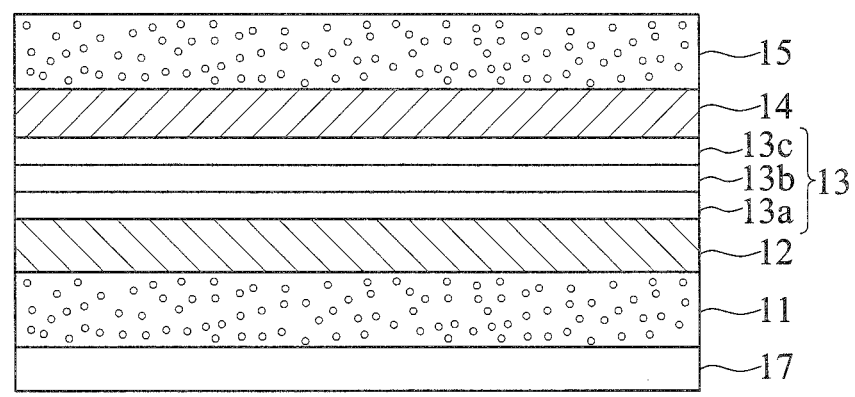
FIG. 2 is a schematic view showing a top emitting organic electroluminescent device having a reflective layer.

In an embodiment, when the micro-particles contained in the first scattering layer 11 in an amount of from 10 to 90% by weight, a reflective layer 17 having optical reflectivity greater than 80% is further formed. As shown in FIG. 2, the reflective layer 17 of the top emitting organic electroluminescent device is formed under the first scattering layer 11, such that the first scattering layer 11 is sandwiched between the reflective layer 17 and first electrode 12.

Figure 3:
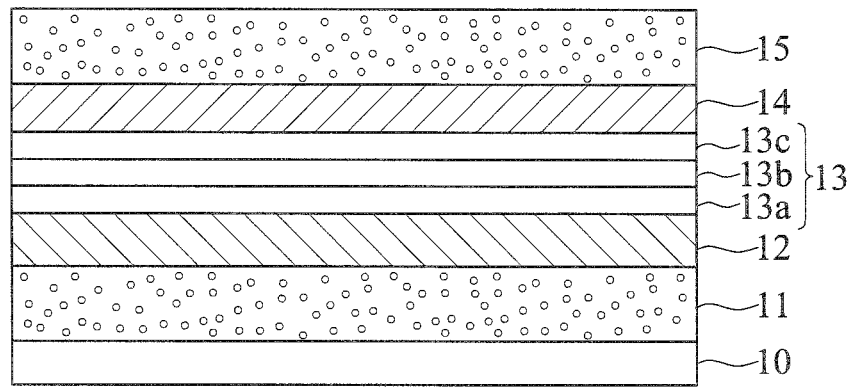
FIG. 3 is a schematic view showing a top emitting organic electroluminescent device having a substrate.

In another embodiment, as shown in FIG. 3, the top emitting organic electroluminescent device further comprises a substrate 10 formed under the first scattering layer 11, such that the first scattering layer 11 is sandwiched between the substrate 10 and first electrode 12.

Figure 4:
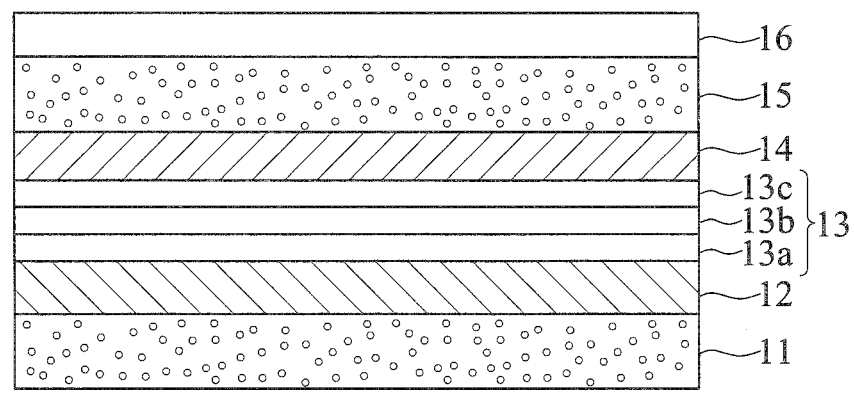
FIG. 4 is a schematic view showing a top emitting organic electroluminescent device having a transparent encapsulating material.

In yet another embodiment, as shown in FIG. 4, the top emitting organic electroluminescent device further comprises a transparent encapsulating material 16 formed on the second scattering layer 15.

In a non-limiting embodiment, the substrate 10, the reflective layer 17 and the transparent encapsulating material 16 may be all formed on the top emitting organic electroluminescent device at the same time, or any two thereof may be selectively formed on the top emitting organic electroluminescent device at the same time, without a particular limitation. When the substrate 10 and the reflective layer 17 are formed at the same time, the substrate 10 is formed under the reflective layer 17, such that the reflective layer 17 is sandwiched between the substrate 10 and first scattering layer 11.

The method of fabricating the top emitting organic electroluminescent device having a substrate and a transparent encapsulating material according to the present disclosure is described as follows.

Figure 5:
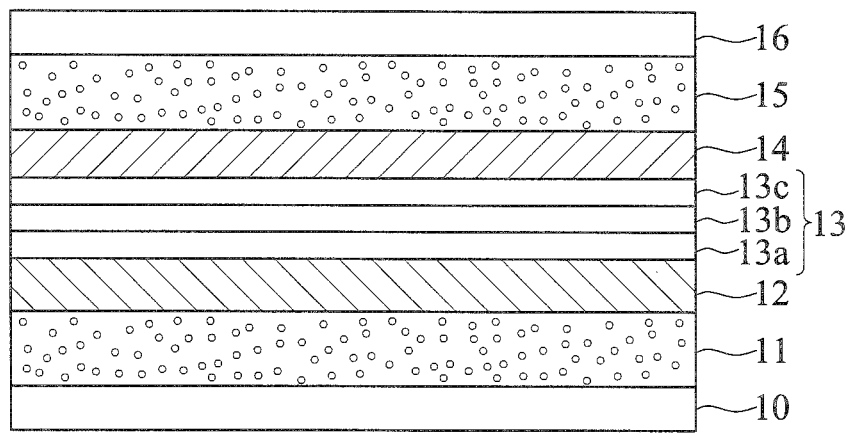
FIG. 5 is a schematic view showing a top emitting organic electroluminescent device having a substrate and a transparent encapsulating material.

Firstly, as shown in FIG. 5, a first scattering layer 11 having a thickness ranging from 300 nm to 30 μm is coated on a substrate 10. The disclosure does not limit the material of the substrate 10. In an embodiment, the substrate 10 is made of a transparent material or a non-transparent material, such as one selected from the group consisting of paper, glass and plastic. The first scattering layer 11 can be separated from the substrate 10 after the light emitting device is fabricated and packaged, and function as a flexible device.

The first scattering layer 11 formed on the substrate 10 has a first polymer and a plurality of first micro-particles. The first micro-particles are 10 to 90 wt % of the first scattering layer 11. In an embodiment, the first polymer is made of a transparent material, and the transparent material has a light transmittance greater than 80%. In an embodiment, the first polymer is at least one selected from the group consisting of acrylic resin, epoxy resin, oxetane resin, silazane or siloxane resin, cyclic polyether compound, polymer with a hydroxyl group, and polyimide.

The first micro-particles are made of oxide or a third polymer. The oxide is at least one selected from the group consisting of silica, aluminum oxide, zirconium dioxide and titanium dioxide. The third polymer is made of a poly methyl methacrylate. The average particle size of the first micro-particles is about 100 nm to 10 μm.

The first scattering layer 11 is formed by firstly dissolving the first polymer in a solvent and mixing the first polymer with the first micro-particles, and then applying and drying the mixture containing the first micro-particles and the first polymer. The solvent is one selected from the group consisting of methyl ethyl ketone, isopropanol, tetrahydrofuran, esters, alcohols, dimethyl formamide, N-methylpyrrolidone, propylene glycol monomethyl ether acetate, 3-methoxy-acetic acid butyl ester, and a mixture thereof. In another method, the first micro-particles are directly mixed in a monomer precursor solvent of the first polymer, a coating and drying process is then performed, and the first scattering layer 11 is formed through monomer polymerization by exposing itself to UV or by a heating method.

Subsequently, a first electrode 12 is formed on the first scattering layer 11 by a thermal evaporation method, a sputtering method, or a plasma enhanced chemical vapor deposition (PECVD) method. The first electrode 12 is an anode and can be a transparent or translucent. For instance, the first electrode 12 may have an optical transmittance of 30 to 90% for a visible light. The first electrode 12 may be metal or bimetal oxide. The metal is one selected from the group consisting of aluminum, silver, gold, platinum, molybdenum, calcium, magnesium and barium. The bimetal oxide is one selected from the group consisting of indium-tin oxide, indium-zinc oxide, antimony-tin oxide and aluminum-zinc oxide. When the first electrode 12 is selected from the metal group, the metal forms a first metal layer having a thickness of 5 to 30 nm.

In an embodiment, the first electrode 12 is formed by stacking two metals, which are, for instance, one selected from the group consisting of aluminum, silver, gold, platinum, molybdenum, calcium, magnesium and barium, and form a first metal layer, which is 5 to 30 nm thick.

In another embodiment, the first electrode 12 is formed by stacking metal and bimetal oxide. For instance, the first electrode 12 is formed by stacking at least one selected from the group consisting of aluminum, silver, gold, platinum, molybdenum, calcium, magnesium and barium and at least one selected from the group consisting of indium-tin oxide, indium-zinc oxide, antimony-tin oxide and aluminum-zinc oxide. The first electrode 12 has a first metal layer made by metal with a thickness of 5 to 30 nm.

After the first electrode 12 is prepared, at least one organic material layer 13 is formed thereon. In FIG. 5, the organic material layer 13 can be multiple layers. For instance, the organic material layers 13 comprise a hole auxiliary layer 13a, an electron auxiliary layer 13c and a light emitting layer 13b formed between the hole auxiliary layer 13a and the electron auxiliary layer 13c.

Figure 6:
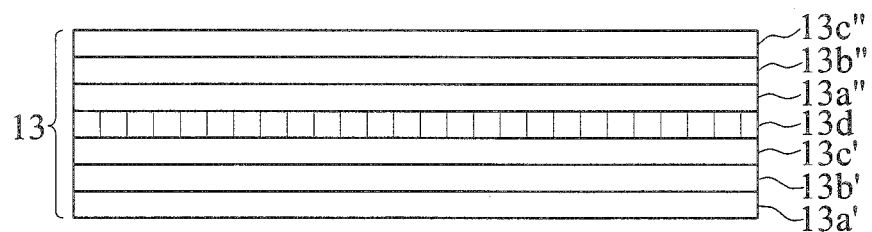
FIG. 6 is a schematic view showing a plurality of organic material layers.

In another example, as shown in FIG. 6, the organic material layers 13 are formed by forming sequentially a first hole auxiliary layer 13a', a first light emitting layer 13b', a first electron auxiliary layer 13c', a charge generation layer 13d, a second hole auxiliary layer 13a", a second light emitting layer 13b" and a second electron auxiliary layer 13c". It should be noted that there is no limit on a number of layers of the organic material layers 13, and the former layers in the previously described sequence can be stacked to form the organic material layers 13.

In a non-limiting embodiment, the hole auxiliary layer 13a is the hole transport layer and/or the hole injection layer, and the electron auxiliary layer 13c is the electron transport layer and/or the electron injection layer.

According to the aforementioned embodiment, the organic material layer 13 can be prepared according to a prior art method, such as, vacuum evaporation, spin coating, ink jet or screen printing.

Subsequently, as shown in FIG. 5, a second electrode 14 is formed on the organic material layer 13. The second electrode 14 can be a cathode, and be fabricated by the same method as the first electrode 12.

The second electrode 14 can be formed, for instance, by a thermal evaporation, sputtering or plasma enhanced chemical vapor deposition method, and can be transparent or translucent and have an optical transmittance of 30 to 90% at a visible light wavelength. The second electrode 14 is a metal or bimetal oxide, the metal is one selected from the group consisting of aluminum, silver, gold, platinum, molybdenum, calcium, magnesium and barium, and the bimetal oxide is one selected from the group consisting of indium-tin oxide, indium-zinc oxide, antimony-tin oxide and aluminum-zinc oxide. Further, when the second electrode 14 is selected from the metal, the metal forms a second metal layer and is 5 to 30 nm thick.

In an embodiment, the second electrode 14 is formed by stacking two metals, which are, for instance, one selected from the group consisting of aluminum, silver, gold, platinum, molybdenum, calcium, magnesium and barium, and the metal stack forms a second metal layer, which is 5 to 30 nm thick.

In another embodiment, the second electrode 14 is formed by stacking metal and bimetal oxide materials. For instance, the second electrode 14 is formed by stacking at least one selected from the group consisting of aluminum, silver, gold, platinum, molybdenum, calcium, magnesium and barium and at least one selected from the group consisting of indium-tin oxide, indium-zinc oxide, antimony-tin oxide and aluminum-zinc oxide. The second electrode 14 contains a second metal layer made by metal with a thickness of 5 to 30 nm.

Subsequently, a second scattering layer 15 having a thickness of 300 nm to 30 μm is formed on the second electrode 14 using a coating method, and has a material the same as or different from that of the first scattering layer 11. The second scattering layer 15 has a second polymer and a plurality of second micro-particles, the second micro-particles are 3 to 50 wt % of the second scattering layer.

In an embodiment, the second polymer is made of a transparent material having a light transmittance greater than 80%. In a non-limiting embodiment, the second polymer is made of at least one selected from the group consisting of acrylic resin, epoxy resin, oxetane resin, silazane or siloxane resin, cyclic polyether compound, polymer with a hydroxyl group, and polyimide.

The second micro-particles are made of oxide compound or a material making up the third polymer, wherein the oxide compound may comprise silica, aluminum oxide, zirconium dioxide and titanium dioxide. The material of the third polymer may comprise poly methyl methacrylate. In addition, the average particle size of the second micro-particles is about 100 nm to 10 μm.

It should be noted that the second scattering layer 15 has a different adhesive property from the second polymer since they use different materials. In an embodiment, the second polymer has an encapsulating adhesive property. In another embodiments, the second polymer does not have the encapsulating adhesive property.

Thus, according to the aforementioned embodiment, besides the adhering of the transparent encapsulating material 16 on the second electrode 14 via the second scattering layer 15 on the second electrode 14, it is also applicable to apply the second scattering layer 15 which has an encapsulating adhesive property on the transparent encapsulating material 16, followed by adhering the transparent encapsulating material 16 on the second electrode 14 in an example, and meanwhile, adhering all the structures on the substrate 10 so as to form an enclosed space protection element.

In an embodiment, the transparent encapsulating material 16 is made of a glass or a plastic composite layer having gas barrier property, and has the light transmittance greater than 80%.

Figure 7:
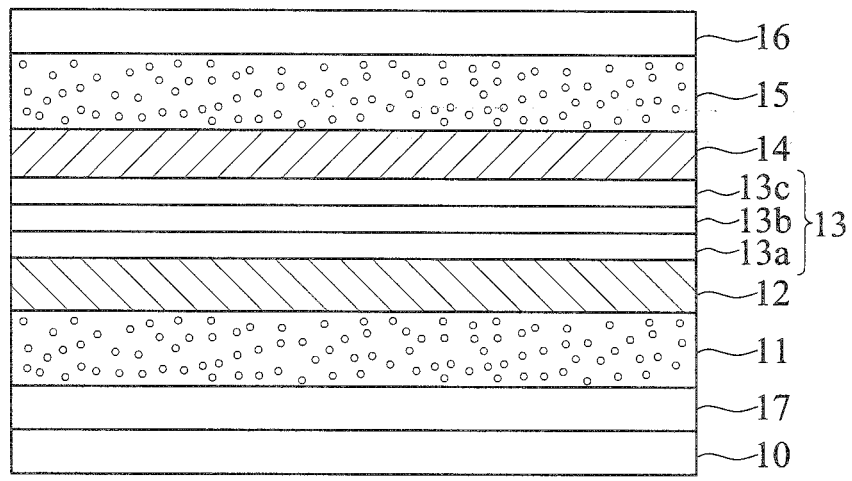
FIG. 7 is a schematic view showing a top emitting organic electroluminescent device having a substrate, a reflective layer and a transparent encapsulating material.

In addition, the present disclosure further provides another type of top emitting organic electroluminescent device having a substrate, a reflective layer and a transparent encapsulating material. As shown in FIG. 7, when the micro-particles of the first scattering layer 11 are 10 to 90 wt % of the first scattering layer 11, a reflective layer 17 having an optical reflectivity greater than 80% is further formed between the substrate 10 and the first scattering layer 11. The reflective layer 17 is made of at least one from the group consisting of aluminum, silver, chromium and titanium. When made of two materials, the reflective layer 17 is made of an alloy or formed by stacking multiple layers on one another.

Figure 8:
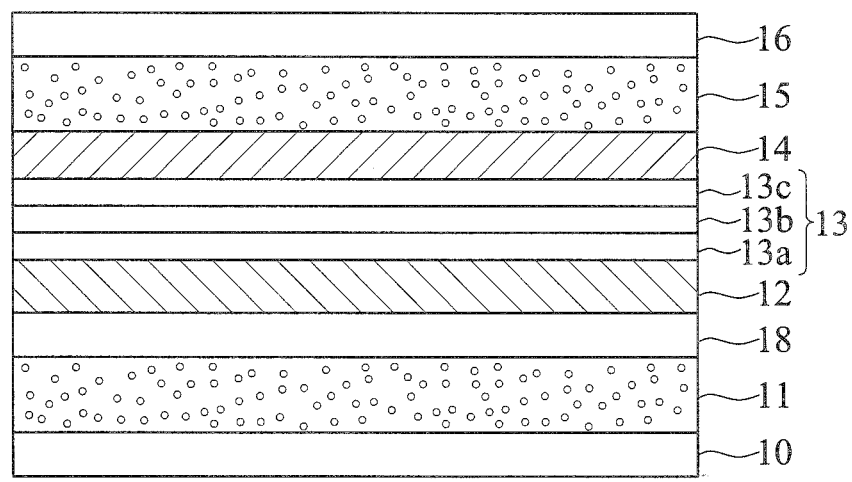
FIG. 8 is a schematic view showing a top emitting organic electroluminescent device having a substrate, an insulative planarizing layer and a transparent encapsulating material.

In another embodiment as shown in FIG. 8, the top emitting organic electroluminescent device disclosed by the present disclosure further comprises at least one insulative planarizing layer 18 formed between the first scattering layer 11 and the first electrode 12, and a substrate 10 and a transparent encapsulating material 16. The insulative planarizing layer 18 has a surface roughness Ra less than 10 nm, and can be made of acrylic resin, or a material that makes the former first polymer.

Figure 9:
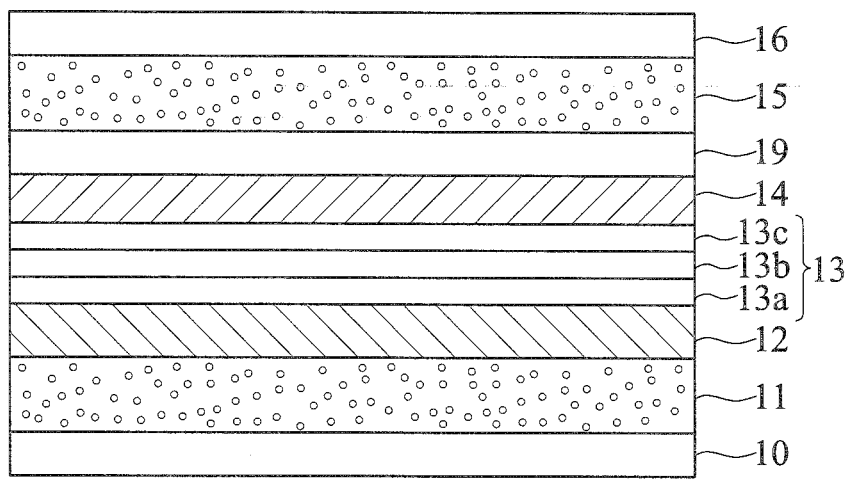
FIG. 9 is a schematic view showing a top emitting organic electroluminescent device having a substrate, a capping layer and a transparent encapsulating material.

In another embodiment, as shown in FIG. 9, the top emitting organic electroluminescent device disclosed by the present disclosure further comprises a capping layer 19 formed between the second electrode 14 and the second scattering layer 15, and a substrate 10 and a transparent encapsulating material 16. The capping layer 19 is made of one selecting from the group consisting of N,N'-bis(1-naphthyl)-N,N'-diphenyl-1,1'-biphenyl-4,4'-diamine (NPB), AlQ$_3$, titanium dioxide, zinc oxide, indium-tin oxide, magnesium oxide, cadmium sulfide, zinc sulfide, and the mixture thereof. Alternatively, multiple layers can be stacked by a method, such as a thermal evaporation method or a sputtering method, to form the capping layer 19. The refractive index of the capping layer 19 is greater than 1.6.

Figure 10:
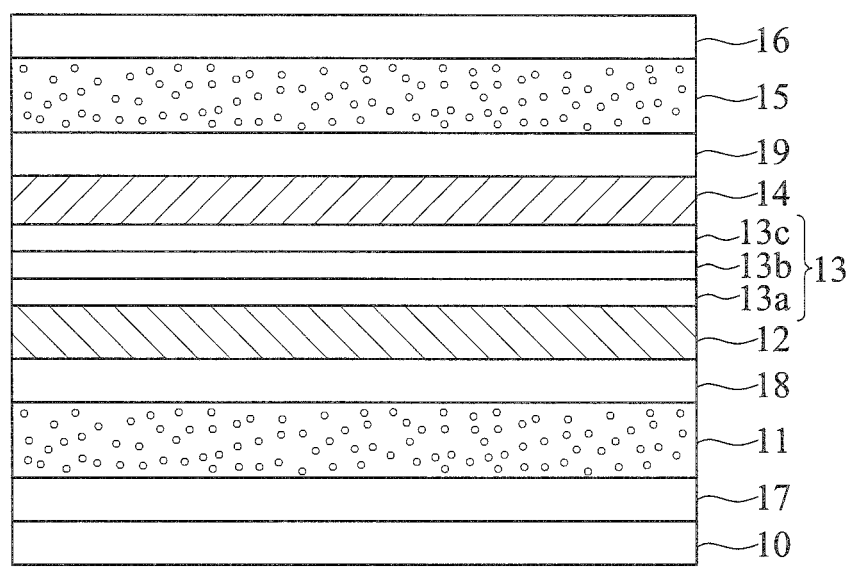
FIG. 10 is a schematic view showing a top emitting organic electroluminescent device having a substrate, a reflective layer, an insulative planarizing layer, a capping layer and a transparent encapsulating material.

In an example, any two or all of the reflective layer 17, the insulative planarizing layer 18 and the capping layer 19 are selectively formed at the same time on the top emitting organic electroluminescent device, without any particular limitations. As shown in FIG. 10, the top emitting organic electroluminescent device also has the reflective layer 17, the insulative planarizing layer 18 and the capping layer 19.

SPECIFIC EMBODIMENTS

Preparation Example 1 Preparation Method of the First Scattering Layer 0.118 g of silica micro-particles (purchased from Panel Group, model number SI-020, particle size around 2 μm) is added to 10 g of acrylic monomer containing solution (obtained from Exceed Material-Tech Corp., model number ESOC-A03, solids content of 22.5%) and thoroughly mixed and suspended to form a first scattering layer solution containing the first micro-particles. Subsequently, a releasing layer is formed on a substrate or a substrate having the reflective layer, Subsequently, the suspended solution is applied on the substrate or the substrate having the reflective layer via a spin coating method (rotational speed of 250 rpm, 30 s followed by rotational speed of 500 rpm, 5 s), then after a pre-bake process at 100 □ for 3 minutes, UV initiated polymerization process proceeds for 3 minutes, followed by a post-bake process at 230° C. for 30 minutes to solidify, so as to complete the formation of the first scattering layer containing 5 wt % of first micro-particles, following that, after the light emitting device is fabricated and completed with the packaging process, a physical method such as using light, heat or mechanical force is employed to the releasing layer to take off the first scattering layer from the substrate or the substrate having the reflective layer. On the other hand, if it is desired to form a light emitting device having the substrate or the substrate with reflective layer thereon, the releasing layer is not required to be formed on the substrate or the substrate having the reflective layer.

In addition, according to the aforementioned method, if required, first scattering layers containing 10 wt %, 15 wt %, 20 wt %, 25 wt %, 30 wt %, 31 wt %, 40 wt %, 50 wt %, 60 wt % and 70 wt % first micro-particles can be respectively formed by adding 0.248 g, 0.393 g, 0.557 g, 0.742 g, 0.954 g, 1.000 g, 1.484 g, 2.225 g, 3.338 g and 5.192 g silica micro-particles respectively in the aforementioned acrylic monomer solution, by the aforementioned method.

Preparation Example 2

Preparation Method of the Second Scattering Layer Having an Encapsulating Adhesive Property 100 g of liquid bisphenol A epoxy resin (828EL) and 30 g of 4,4'-diaminodiphenyl sulfone (DDS) are added in a vertically reaction flask, and a first mixture is formed after 80 minutes of thoroughly mixing and stirring at 130° C. Subsequently, 5 g phenoxy resin (4250), 20 g cresol novolac epoxy resin (ECN1299), 5 g of solid bisphenol A epoxy resin (R301), 20 g of 3,3',5,5'-Tetramethyl-4,4'-diglycidyloxybiphenylhomopolymer (YX4000), 25 g of liquid bisphenol A epoxy resin(828EL) and 15 g of acrylic oligomer (3710) are added in a vertical reaction flask, and thoroughly mixed at 160° C. to form a second mixture is formed. Lastly, 3.75 g of the first mixture, 16.25 g of the second mixture and 2 g of the silica micro-particles are mixed to form the polymer having the encapsulating adhesive property. Subsequently, the polymer is applied on the transparent encapsulating material by the doctor blade method, to complete the formation of the second scattering layer having a film thickness ranged from 300 nm to 30 μm, wherein the silica micro-particles are in an amount of 9 wt % by the total weight of the second scattering layer. The amount of the silica micro-particles added in can be adjusted from 3 to 50 wt %. The second scattering layer has an encapsulating adhesive property, and thus the device that has completed by the process of vapor deposition can be directly adhered thereto to complete the packaging process without using extra adhesive materials.

Preparation of a Conventional Light Emitting Device

Comparative Example 1

On the glass substrate applying acrylic resin (Exceed ESOC-A03) twice, to form an insulative planarizing layer having a thickness of 1 to 30 μm. Subsequently, a vapor deposition method is employed with aluminum (50 nm), silver (30 nm) and a sputtering method with indium-tin oxide (ITO) (argon gas is a working gas, flow rate of 30 sccm, DC power 200 W, deposited for 3 minutes, working pressure of $2.0 \times 10^{-3}$ Pa, thickness of 20 nm), to form the first electrode composite layer (Al/Ag/ITO) having a reflective layer. Then, ozone is generated by an UV ozone generator, and after the surface of the first electrode is processed to be more hydrophilic, PEDOT is applied thereon (rotational speed of 500 rpm for 5 seconds followed by rotational speed of 2000 rpm for 30 s, and then heated at 120° C., for 10 minutes for drying). Subsequently, 0.027 g Tris(4-carbazoyl-9-ylphenyl) amine (TCTA) (as shown in the following Chemical Formulae 1) and 0.003 g of PO-08 functioning as yellow light emitting material (as shown in the following Chemical Formulae 2) are dissolved in 6 g of toluene solvent, and spin coated on the PEDOT layer (rotational speed of 1500 rpm, 30 s), to form a yellow light emitting layer, followed by vapor deposition of 50 nm TmPyPb(1,3,5-Tri [(3-pyridyl)-phen-3-yl]benzene) (as shown in the following Chemical Formulae 3), 1 nm lithium fluoride (LiF), 5 nm Al, 15 nm Ag, and 27 nm zinc sulfide (ZnS), respectively functioning as the electron injection layer, second electrode (Al/Ag) and capping layer. Lastly, the transparent glass is used as transparent encapsulating material, and a commercially available adhesive is used to adhere the transparent glass and the elements on the substrate, so as to complete the formation of the light emitting device 1.

Chemical Formulae 1

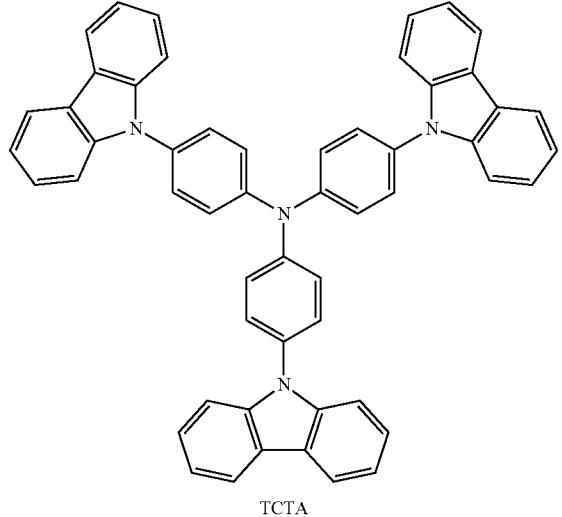

TCTA

Chemical Formulae 2

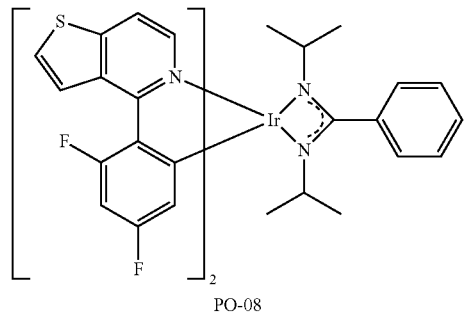

PO-08

-continued

Chemical Formulae 3

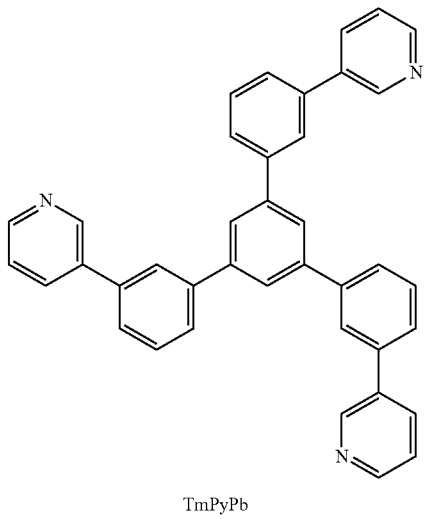

TmPyPb

Comparative Example 2

The same preparation method as the comparative example 1, except that a second scattering layer (microlens diffusor film obtained from EFUN Technology) having no adhesiveness is adhered on the capping layer, and then the transparent glass is used as the encapsulating packaging material to complete the formation of the light emitting device 2.

Comparative Example 3

The same preparation method as the comparative example 1, except that the reflective layer and first electrode are separated. First, the aluminum reflective layer having a thickness of 50 nm (reflectivity R>80%) is formed on the glass substrate, then the insulative planarizing layer is formed, to form the first electrode (ITO) (argon gas is the working gas, flow rate of 28 sccm, DC power of 200 W, deposited for 20 minutes, working pressure of $3.0\times10^{-3}$ Pa) having a thickness of 180 nm, followed by UV-Ozone treatment, to sequentially form the PEDOT, yellow light emitting layer, electron transport layer, electron injection layer, second electrode, capping layer and transparent glass for encapsulation, so as to complete the formation of the light emitting device 3.

Comparative Example 4

The same preparation method as the comparative example 3, except that the capping layer has a second scattering layer which is the same as that of comparative example 2 attached thereon, followed by encapsulation by a transparent glass, so as to complete the formation of the light emitting device 4.

Preparation of a Bottom Light Emitting Device of the Prior Art

After the surface treatment of the commercially available ITO substrate by UV-Ozone, PEDOT which is the same as that in comparative Example 1, yellow light emitting layer, electron transport layer, electron injection layer, are sequentially formed and then an aluminum having a thickness of 80 nm functions as a second electrode, followed by encapsulation by a transparent glass, so as to complete the formation of the bottom light emitting device of the prior art.

Preparation of the Top Light Emitting Device Disclosed by the Present Disclosure Embodiment 1

First, an aluminum reflective layer having a thickness of 50 nm (reflectivity R>80%) is formed on the glass substrate, followed by forming a first scattering layer containing 10 wt % silica. Following that, referring to the method described in comparative example 3, the insulative planarizing layer, first electrode, PEDOT, yellow light emitting layer, electron transport layer, electron injection layer, second electrode, capping layer and transparent glass for encapsulation are sequentially formed, thereby completing the formation of the light emitting device 5.

Embodiment 2

The same preparation method as embodiment 1, except a second scattering layer which is the same as that in Comparative Example 2 is attached on the capping layer, followed by an encapsulation process with the transparent glass, thereby completing the formation of the light emitting device 6.

Embodiment 3

The same preparation method as embodiment 1, with the exception that silica content of the first scattering layer is raised to 15 wt %, thereby completing the formation of the light emitting device 7.

Embodiment 4

The same preparation method as embodiment 3, except that a second scattering layer which is the same as that in comparative example 2 is attached on the capping layer, followed by an encapsulation process with the transparent glass, thereby completing the formation of the light emitting device 8.

Embodiment 5

The same preparation method as embodiment 1, with the exception that silica content of the first scattering layer is raised to 31 wt %, thereby completing the formation of the light emitting device 9.

Embodiment 6

The same preparation method as embodiment 5, except that a second scattering layer which is the same as that in comparative example 2 is attached on the capping layer, followed by an encapsulation process with the transparent glass, thereby completing the formation of the light emitting device 10.

Embodiment 7

The same preparation method as embodiment 1, with the exception that silica content of the first scattering layer is raised to 60 wt %, thereby completing the formation of the light emitting device 11.

Embodiment 8

The same preparation method as embodiment 7, except that a second scattering layer which is the same as that in comparative example 2 is attached on the capping layer, followed by an encapsulation process with the transparent glass, thereby completing the formation of the light emitting device 12.

Embodiment 9

The same preparation method as embodiment 7, except that it does not have the aluminum reflective layer, thereby completing the formation of the light emitting device 13.

Embodiment 10

The same preparation method as embodiment 9, except that a second scattering layer which is the same as that in comparative example 2 is attached on the capping layer, followed by an encapsulation process with the transparent glass, thereby completing the formation of the light emitting device 14.

The reflective layer of the light emitting device 1 to 14, the first scattering layer and the second scattering layer are described in Table 1.

TABLE 1

| | reflective layer | silica content of the first scattering layer | second scattering layer |
|---|---|---|---|
| light emitting device 1 | first electrode composite layer | without containing the first scattering layer | X |
| light emitting device 2 | first electrode composite layer | without containing the first scattering layer | ○ |
| light emitting device 3 | aluminum reflective layer | without containing the first scattering layer | X |
| light emitting device 4 | aluminum reflective layer | without containing the first scattering layer | ○ |
| light emitting device 5 | aluminum reflective layer | 10 wt % | X |
| light emitting device 6 | aluminum reflective layer | 10 wt % | ○ |
| light emitting device 7 | aluminum reflective layer | 15 wt % | X |
| light emitting device 8 | aluminum reflective layer | 15 wt % | ○ |
| light emitting device 9 | aluminum reflective layer | 31 wt % | X |
| light emitting device 10 | aluminum reflective layer | 31 wt % | ○ |
| light emitting device 11 | aluminum reflective layer | 60 wt % | X |
| light emitting device 12 | aluminum reflective layer | 60 wt % | ○ |
| light emitting device 13 | X | 60 wt % | X |
| light emitting device 14 | X | 60 wt % | ○ |

Test Method

Test Equipment

Power supply for element test is Keithley 238 voltage and current meter. The relation between brightness and wavelength is determined by the records of SpectraScan PR-655. Element efficiency is calculated by the results from the former two equipments. Reflectivity and light transmittance are measured by n&k 1280.

Figure 11:
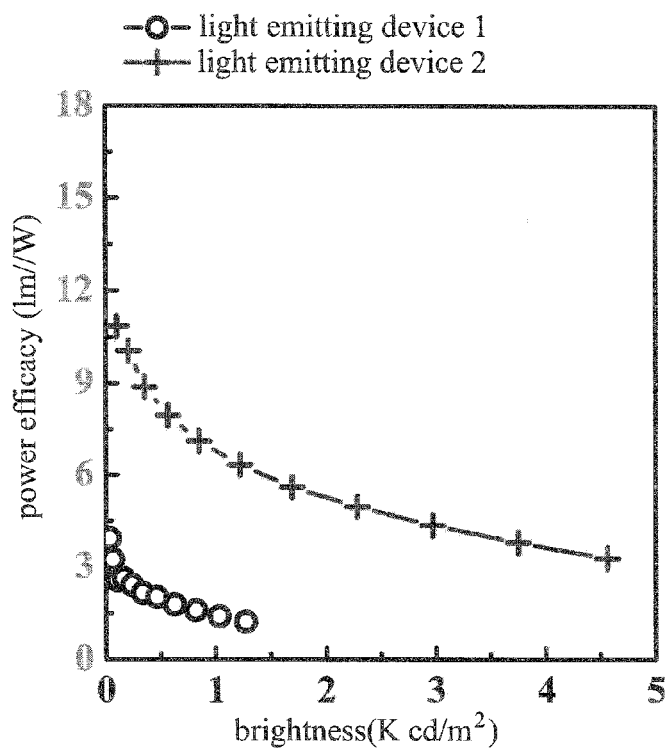
FIG. 11 is a schematic view showing the power efficacy curve of light emitting devices 1 and 2.

First, a power efficacy test is conducted of the conventional light emitting device 1 and light emitting device 2. As shown in FIG. 11, the light emitting device 2 having the second scattering layer provides 3 times more efficient than that of the light emitting device 1.

Similarly, power efficacy tests are conducted to compare the light emitting device 3 and the light emitting device 4, the light emitting device 5 and the light emitting device 6, the light emitting device 7 and the light emitting device 8, the light emitting device 9 and light emitting device 10, respectively shown in FIGS. 13, 15, 17 and 19. The results showed all of the light emitting devices having the second scattering layer have higher efficiency.

Figure 12:
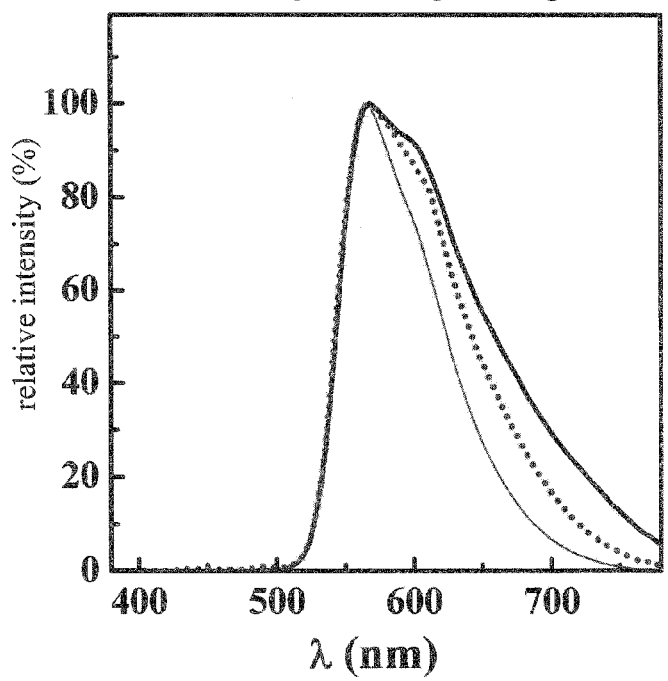
FIG. 12 is a schematic view showing the relative wavelength intensity curve of the light emitting devices 1 and 2.
Figure 13:
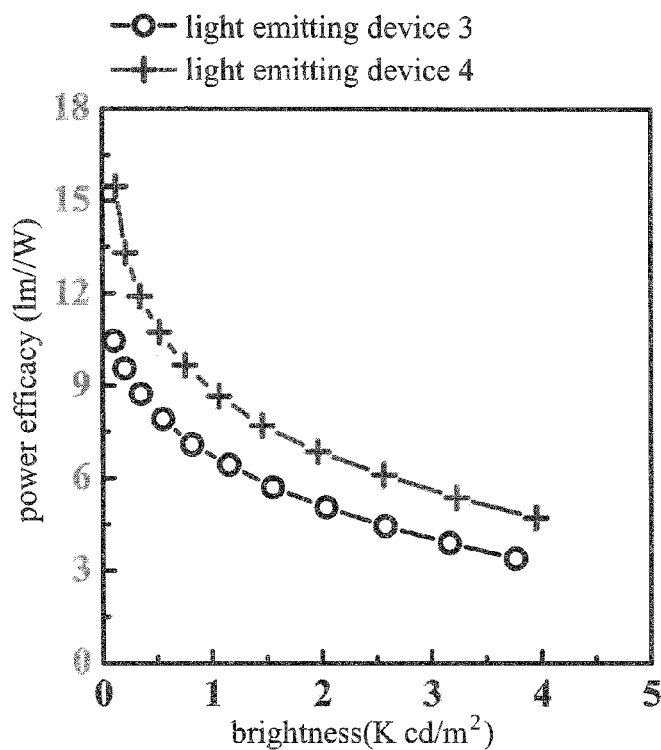
FIG. 13 is a schematic view showing the power efficacy curve light emitting devices 3 and 4.

As shown in FIG. 12, compared with the light spectrum of the light emitting device 1 having 1033 nits brightness, the light spectrum of light emitting device 2 has 1220 nits, and a conventional bottom emitting light emitting device having 2818 nits brightness, except the main peak at 568 nm, both the light emitting device 1 and light emitting device 2 also comprise a resonance peak at a wavelength of 600 to 610 nm. In other words, the microcavity effect has occurred, causing the light spectrum to deviate from the original light spectrum.

Figure 14:
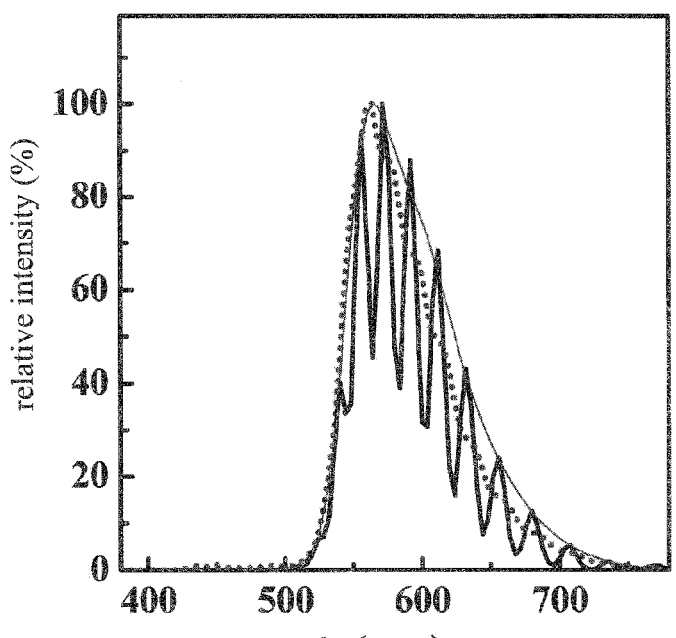
FIG. 14 is a schematic view showing the relative wavelength intensity curve of the light emitting devices 3 and 4.
Figure 15:
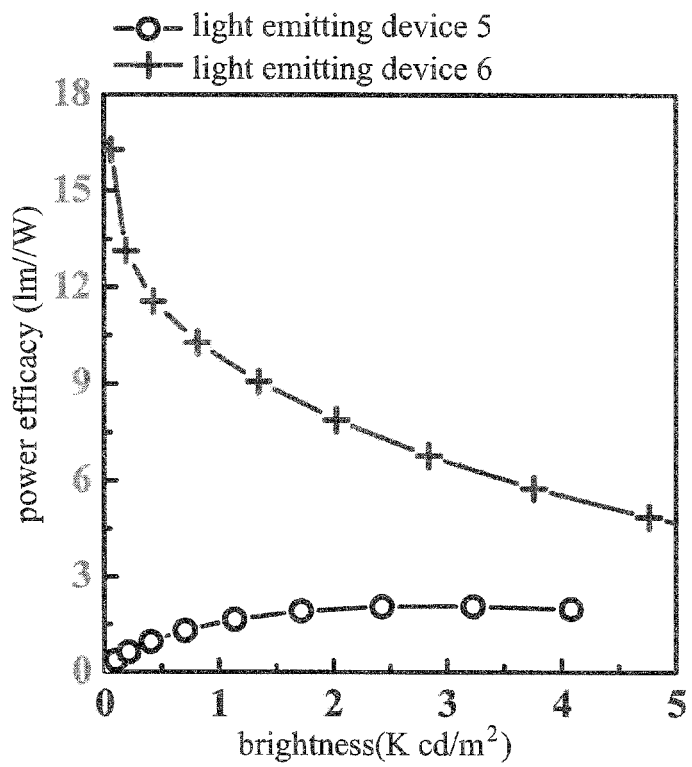
FIG. 15 is a schematic view showing the power efficacy curve of light emitting devices 5 and 6.

Further, as shown in FIG. 14, compared with the light spectrum of the conventional bottom emitting light emitting device, the light emitting device 3 and the light emitting device 4 in which the aluminum metal plane surface serves as a reflective layer still produce a greater amount of jagged optical interference even in the light emitting device 4 having the second scattering layer, wherein the interference could not be eliminated completely.

Figure 16:
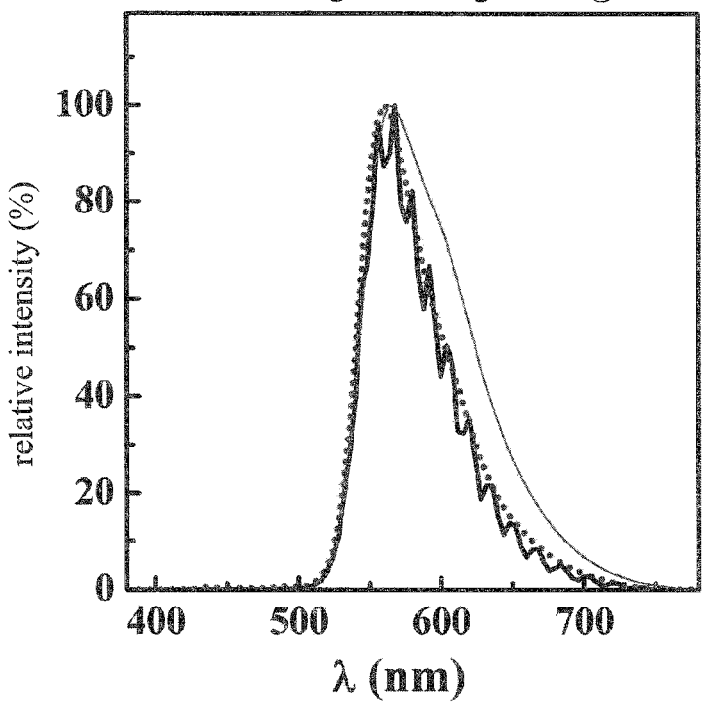
FIG. 16 is a schematic view showing the relative wavelength intensity curve of the light emitting devices 5 and 6.
Figure 17:
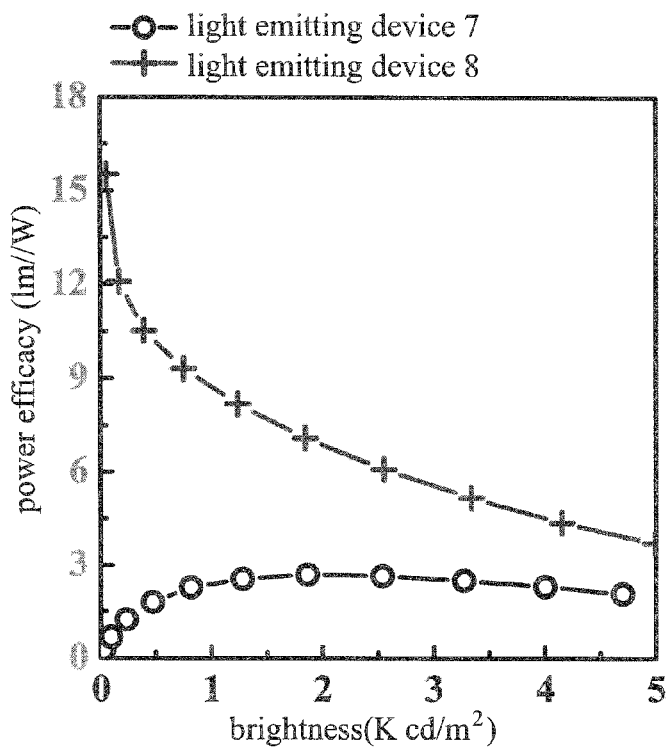
FIG. 17 is a schematic view showing the power efficacy curve of light emitting devices 7 and 8.
Figure 18:
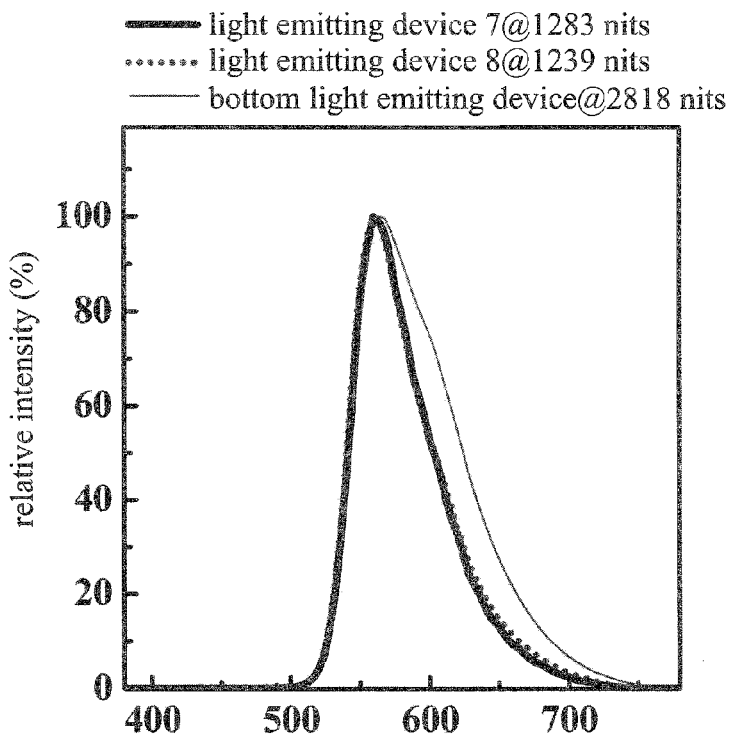
FIG. 18 is a schematic view showing the relative wavelength intensity curve of the light emitting devices 7 and 8.
Figure 19:
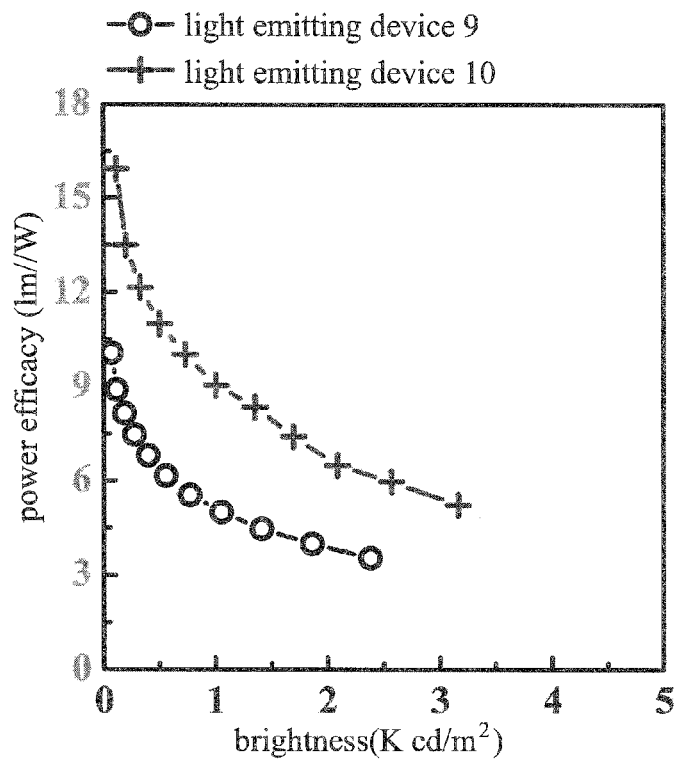
FIG. 19 is a schematic view showing the power efficacy curve of light emitting devices 9 and 10.
Figure 20:
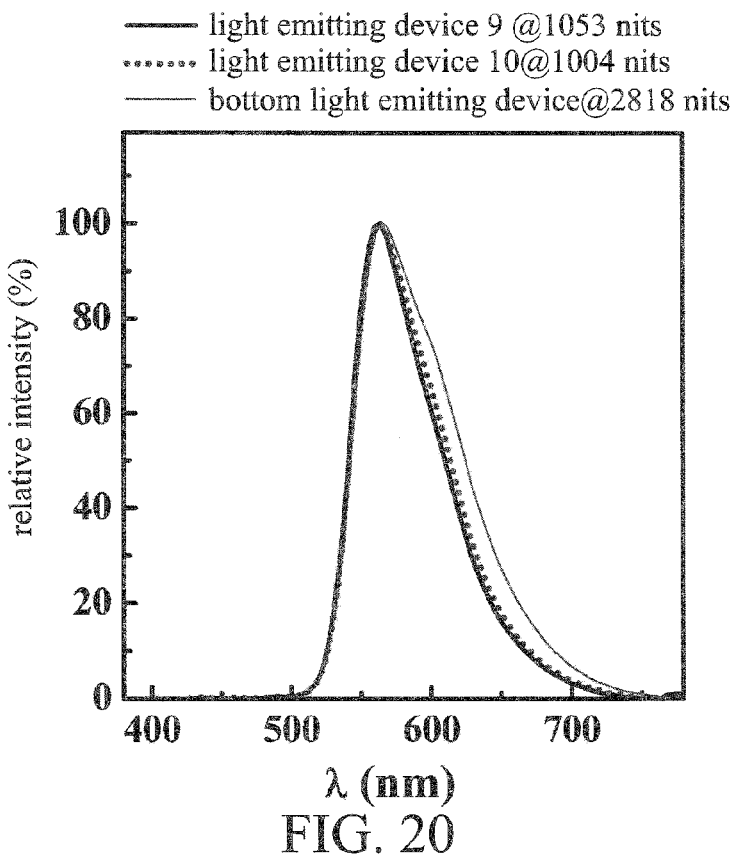
FIG. 20 is a schematic view showing the relative wavelength intensity curve of the light emitting devices 9 and 10.
Figure 21:
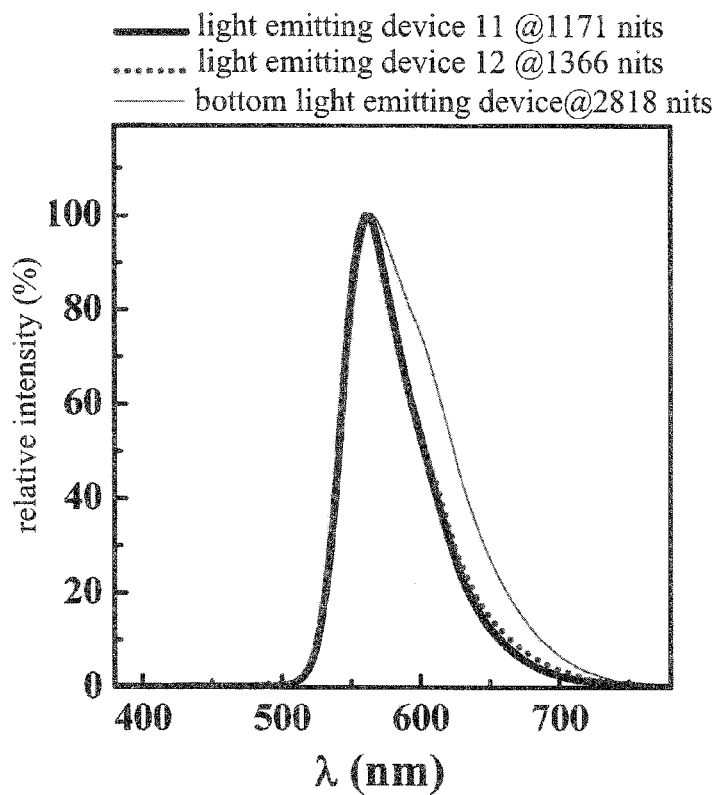
FIG. 21 is a schematic view showing the relative wavelength intensity curve of light emitting devices 11 and 12.
Figure 22:
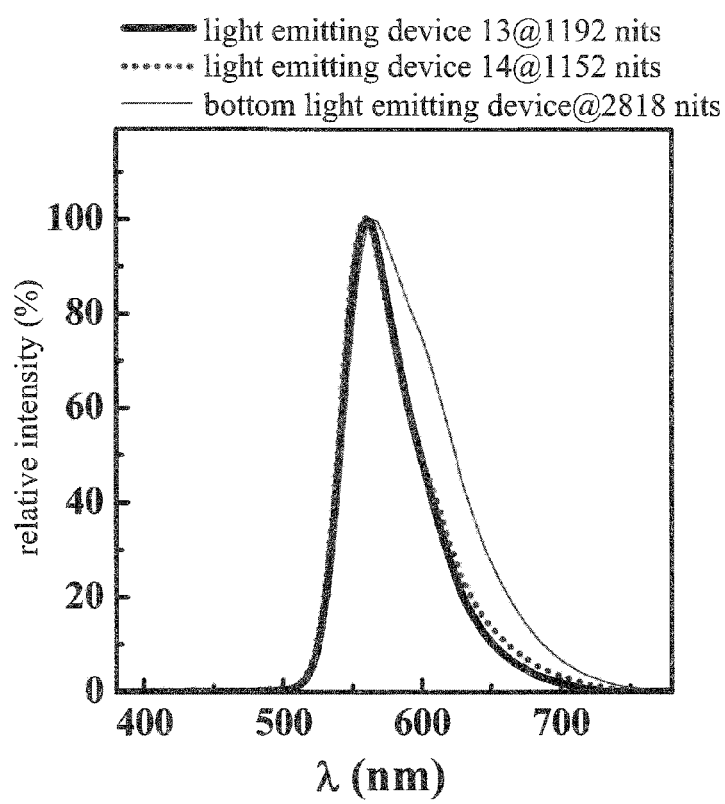
FIG. 22 is a schematic view showing the relative wavelength intensity curve of light emitting devices 13 and 14.

In contrast, as shown in FIG. 16, comparing the light spectrums of the light emitting device 5 and the light emitting device 6 with the conventional bottom emitting light emitting device, the differences in light spectrum of the light emitting device 5 and the light emitting device 6 having the first scattering layer containing 10 wt % silica and that of the bottom emitting light emitting device are significantly reduced.

Similarly, comparing the light spectrum of light emitting device 7 and light emitting device 8, light emitting device 9 and light emitting device 10, light emitting device 11 and light emitting device 12, light emitting device 13 and light emitting device 14 and with the light spectrum of a conventional light emitting device, respectively shown in FIGS. 18, 20, 21 and 22, the light emitting device of the first scattering layer having silica content of more than 15 wt % completely eliminates the generation of optical interference, and optical deviation, resulting in very little difference in the light spectrum compared to the bottom emitting element. The light emitting devices 13 and 14 having no reflective layer also possess the same property.

Figure 23:
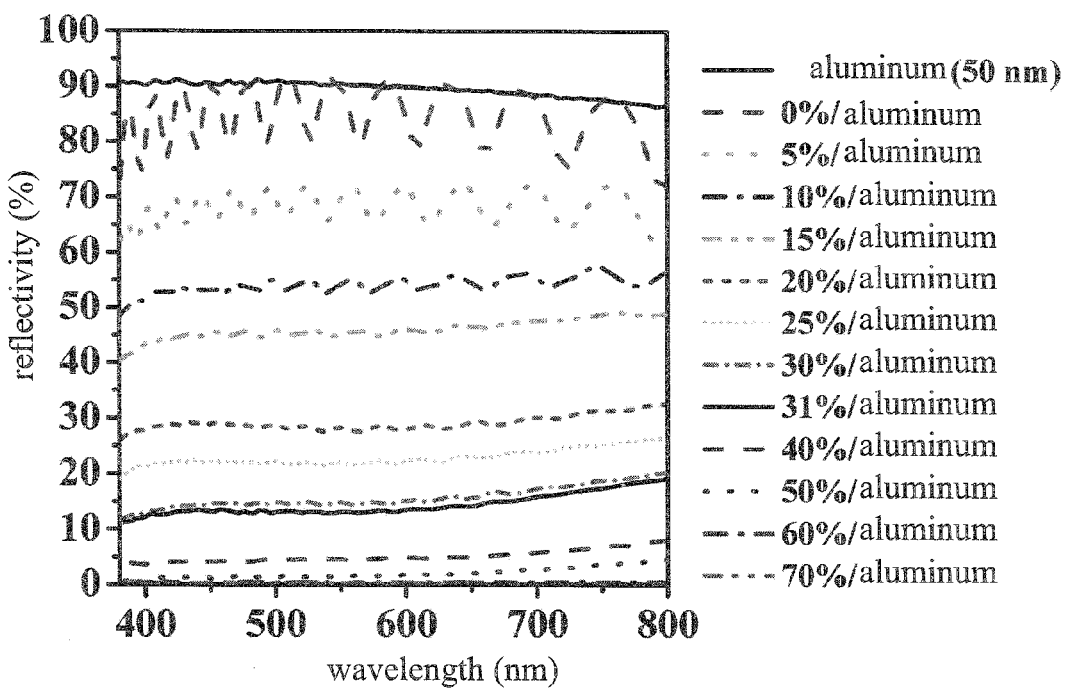
FIG. 23 is a schematic view showing the reflectivity curve of the first scattering layer containing different amounts of the first micro-particles, being applied on an aluminum reflective layer.
Figure 24:
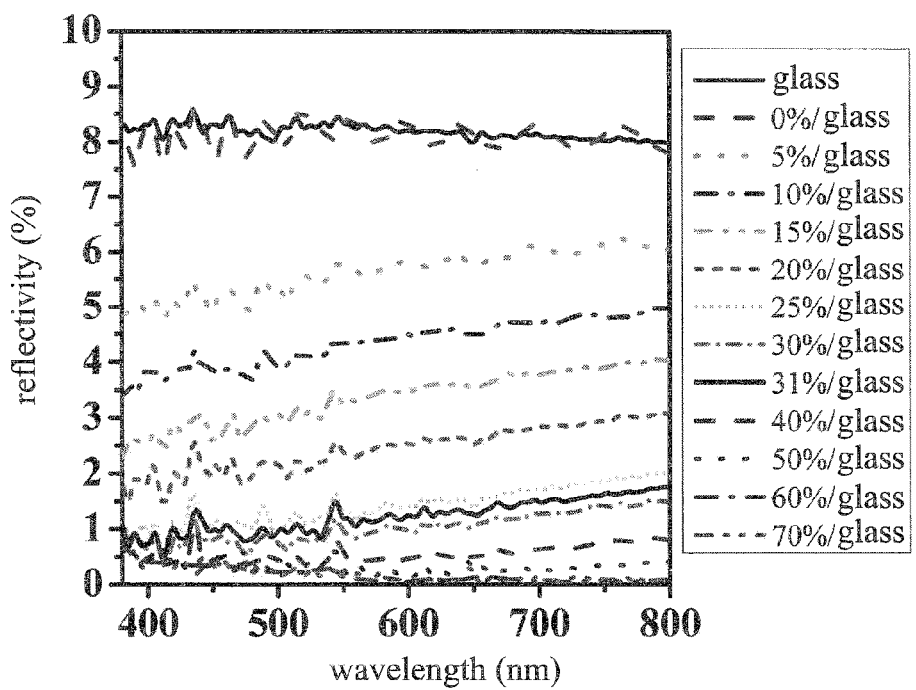
FIG. 24 is a schematic view showing the reflectivity curve of the first scattering layers containing different amounts of the first micro-particles, being applied on a glass substrate.
Figure 25:
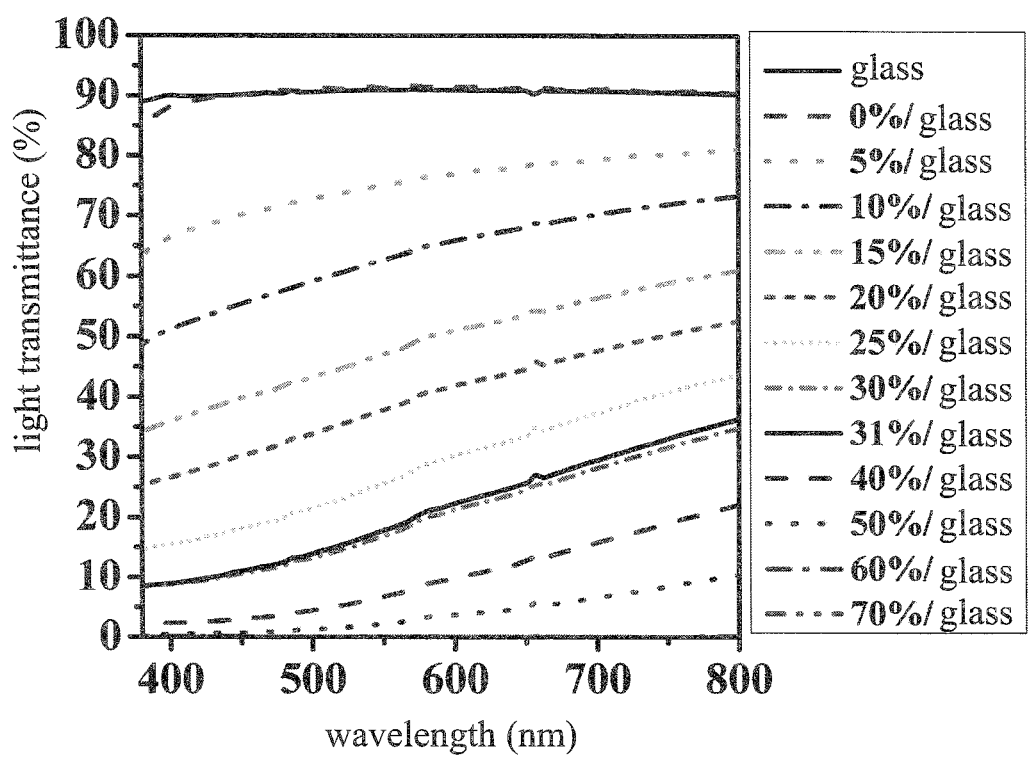
FIG. 25 is a schematic view of the light transmittance of the first scattering layers containing different amounts of the first micro-particles, being applied on the glass substrate.

In addition, the reflectivity test results of the first scattering layers containing different amount of silica, respectively coated on the aluminum reflective layer and glass substrate, are shown in FIGS. 23 and 24. With the first scattering layer containing 60 wt % silica respectively coated on the aluminum reflective layer (60%/aluminum as shown in FIG. 23) and the glass substrate (60%/glass as shown in FIG. 24), the reflectivity on the aluminum reflective layer and glass substrate is close to zero. This means when the light reaches to first scattering layer, it scatters, and the reflective light reflected from the reflective layer or the glass substrate is close to zero. Further, the light transmittance test results of the first scattering layers containing different amount of silica, respectively coated on the a glass substrate, are shown in FIG. 25. With first scattering layer containing 60 wt % silica coated on the glass substrate (60%/glass as shown in FIG. 25), the light transmittance on the glass substrate is close to zero. This means when the light reaches to first scattering layer, the light transmitted directly through the glass substrate is close to zero. In other words, the occurrence of light emitting from the bottom is prevented in the top emitting light emitting device having the first scattering layer. Accordingly, as shown in FIGS. 23 to 25, there is no need to form reflective layer and glass substrate for the top emitting light emitting device having the first scattering layer containing more than 60 wt % silica.

In summary, with the use of the second scattering layer, the light emitting efficacy for the top emitting light emitting device is enhanced. In addition, in the light emitting device having a first scattering layer containing silica in an amount of 10 to 60 wt %, both microcavity effect and optical deviation could be prevented from occurrence, allowing the light spectrum of the top emitting light emitting device to resemble the light spectrum of the bottom emitting light emitting device. Further, there is no need to form the reflective layer and glass substrate for the top emitting light emitting device having the first scattering layer containing more than 60 wt % silica.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A top emitting organic electroluminescent device, comprising:
    a first scattering layer having a first polymer and a plurality of first micro-particles, wherein the first micro-particles are 10 to 90 wt % of the first scattering layer;
    a first electrode formed on the first scattering layer and having a visible light transmittance ranging from 30 to 90%;
    at least one organic material layer formed on the first electrode;
    a second electrode formed on the organic material layer and having a visible light transmittance ranging from 30 to 90%;
    a second scattering layer formed on the second electrode and having a second polymer and a plurality of second micro-particles, wherein the second micro-particles are 3 to 50 wt % of the second scattering layer; and
    a reflective layer formed under the first scattering layer and having an optical reflectivity greater than 80%,
    wherein the first scattering layer is sandwiched between the reflective layer and the first electrode.

2. The top emitting organic electroluminescent device of claim 1, wherein the first micro-particles are 10 to 60 wt % of the first scattering layer.

3. The top emitting organic electroluminescent device of claim 1, wherein the reflective layer is made of at least one selected from the group consisting of aluminum, silver, chromium and titanium.

4. The top emitting organic electroluminescent device of claim 1, further comprising a substrate formed under the reflective layer, wherein the reflective layer is sandwiched between the substrate and the first scattering layer.

5. The top emitting organic electroluminescent device of claim 1, further comprising a substrate formed under the first scattering layer, wherein the first scattering layer is sandwiched between the substrate and the first electrode.

6. The top emitting organic electroluminescent device of claim 1, further comprising a transparent encapsulating material formed on the second scattering layer.

7. The top emitting organic electroluminescent device of claim 1, further comprising an insulative planarizing layer formed between the first scattering layer and the first electrode and having a surface roughness less than 10 nm.

8. The top emitting organic electroluminescent device of claim 1, further comprising a capping layer formed between the second electrode and the second scattering layer, made of at least one selected from the group consisting of N,N'-bis(1-naphthyl)-N,N'-diphenyl-1,1'-biphenyl-4,4'-diamine (NPB), $AlQ_3$, titanium dioxide, zinc oxide, indium-tin oxide, magnesium oxide, cadmium sulfide and zinc sulfide, and having a reflectivity greater than 1.6.

9. The top emitting organic electroluminescent device of claim 1, wherein the first polymer and the second polymer are made of a transparent material that has a visible light transmittance greater than 80%, and the first polymer and the second polymer are made of at least one selected from the group consisting of acrylic resin, epoxy resin, oxetane resin, silazane or siloxane resin, cyclic polyether compound, polymer with a hydroxyl group, and polyimide.

10. The top emitting organic electroluminescent device of claim 1, wherein the first micro-particles and the second micro-particles are made of oxide or a third polymer individually.

11. The top emitting organic electroluminescent device of claim 10, wherein the oxide is at least one selected from the group consisting of silica, aluminum oxide, zirconium dioxide and titanium dioxide.

12. The top emitting organic electroluminescent device of claim 10, wherein the third polymer is poly methyl methacrylate.

13. The top emitting organic electroluminescent device of claim 1, wherein the first micro-particles have an average particle size ranging from 100 nm to 10 μm, and the second micro-particles have an average particle size ranging from 100 nm to 10 μm.

14. The top emitting organic electroluminescent device of claim 1, wherein the first scattering layer has a thickness ranging from 300 nm to 30 μm, and the second scattering layer has a thickness ranging from 300 nm to 30 μm.

15. The top emitting organic electroluminescent device of claim 1, wherein the first electrode and the second electrode are made of at least one selected from the group consisting of metal and bimetal oxide, the metal is at least one selected from the group consisting of aluminum, silver, gold, platinum, molybdenum, calcium, magnesium and barium, and the bimetal oxide is at least one selected from the group consisting of indium-tin oxide, indium-zinc oxide, antimony-tin oxide and aluminum-zinc oxide.

16. The top emitting organic electroluminescent device of claim 1, wherein the first electrode has a first metal layer made of metal and having a thickness ranging from 5 to 30 nm, the second electrode has a second metal layer made of metal and having a thickness ranging from 5 to 30 nm.

17. The top emitting organic electroluminescent device of claim 1, wherein the organic material layer comprises at least one hole auxiliary layer, at least one electron auxiliary layer, and at least one light emitting layer formed between the at least one hole auxiliary layer and the at least one electron auxiliary layer.

18. The top emitting organic electroluminescent device of claim 1, wherein the organic material layer comprises a first hole auxiliary layer, a first light emitting layer, a first electron auxiliary layer, a charge generation layer, a second hole auxiliary layer, a second light emitting layer and a second electron auxiliary layer that are formed sequentially.

* * * * *